United States Patent
Martin et al.

(10) Patent No.: US 6,803,794 B2
(45) Date of Patent: Oct. 12, 2004

(54) DIFFERENTIAL CAPACITANCE SENSE AMPLIFIER

(75) Inventors: Mark V. Martin, Redondo Beach, CA (US); John J. Drab, Santa Barbara, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 10/375,563

(22) Filed: Feb. 26, 2003

(65) Prior Publication Data

US 2004/0164771 A1 Aug. 26, 2004

(51) Int. Cl.[7] .............................................. G01R 19/00
(52) U.S. Cl. .......................... 327/52; 327/54; 330/258
(58) Field of Search ...................... 327/51–57; 330/258; 365/189.07, 207

(56) References Cited

U.S. PATENT DOCUMENTS

| 5,140,548 A | 8/1992 | Brennan |
| 5,309,390 A | 5/1994 | Brennan |
| 5,729,488 A | 3/1998 | Drab |
| 6,621,343 B2 * | 9/2003 | Hart ........................... 330/254 |

OTHER PUBLICATIONS

Analysis of Electric Raids, Space, charges, and Polarization of Thin–Film Ferroelectric Capacitors Based on Landau Theory by Claren J. Brennan, 6 pgs., MRS Proc. (Fall 1891).

Rochelle Salt As a Dielectric by C.B. Sawyer and C.H. Tower, The Brush Laboratories, Cleveland Physical Review dated Feb. 1, 1930, vol. 35, pp. 269–273.

* cited by examiner

Primary Examiner—Kenneth B. Wells
(74) Attorney, Agent, or Firm—Leonard A. Alkov

(57) ABSTRACT

A differential capacitance sense amplifier capable of measuring a small difference-signal capacitance in the presence of circuit mismatches and large unequal interconnect capacitances. The sense amplifier includes three sections: a common-mode section applies a 'read' voltage to two capacitors in a manner that rejects unequal interconnect capacitance, a difference-mode section generates a signal proportional to the capacitance difference between the two capacitors, and an offset-canceling section compensates for circuit mismatches in the difference-mode section. The amplifier can be adapted for use as a sense amplifier for a ferroelectric differential capacitance memory unit.

36 Claims, 5 Drawing Sheets

DIFFERENTIAL CAPACITANCE SENSE AMPLIFIER

BACKGROUND OF THE DISCLOSURE

A ferroelectric memory element can be modeled as a pair of capacitors with a small differential capacitance, as disclosed in U.S. Pat. No. 5,729,488, the entire contents of which are incorporated herein by reference. The differential capacitance and mean capacitance values change significantly with temperature, voltage, and voltage history. A "1"/"0" is written into the element or cell containing two ferroelectric capacitors by applying (+/−) write voltage (Vwrite) to one element, and (−/+) Vwrite to the other element. Vwrite is typically the power supply voltage +5V, or +3.3V, etc., so the write driver circuitry can be made of standard CMOS inverters.

To read the data from the memory cell, a sense amplifier applies a read voltage (Vread) to the two ferroelectric elements in the cell, and senses the difference in capacitance between them (Cf−Cfb) by measuring the charge differential resulting from applying the read voltage (Vread). The read voltage (Vread) is typically less than 1V.

If too large a read voltage is applied, the ferroelectric elements will be re-written. If too small a read voltage is applied, the differential capacitance will approach zero. Appropriate values of the read voltage vary with temperature and the manufacturing details of the ferroelectric element. The differential capacitance (Cf−Cfb) is large for the first few reads after a write; for example, the capacitance of one of the elements (Cf) might be twice as large as the capacitance of the second element (Cfb). After many writes, particularly with temperature cycling, Cf might only be a few percent larger than Cfb. To maximize memory density, Cf and Cfb should be as small as possible.

A sense amplifier should be capable of applying a well-controlled read voltage to ferroelectric memory elements, and reliably sensing a wide range of differential capacitance.

A major challenge in designing a non-destructive-read ferroelectric memory is that the differential signal capacitance may vary greatly as a function of temperature, temperature history and the number of times a capacitor has been 'read', among other factors. Because of these ferroelectric capacitor characteristics, a sense amplifier should be capable of correctly sensing the small differential signal capacitance in the presence of large and/or poorly controlled non-signal capacitances. In addition, a sense amplifier should provide adequate sensitivity even where there are component mismatches within the amplifier itself.

Embodiments of the invention are adaptable for use in a radiation-hard ferroelectric memory with good manufacturability, operation over a wide temperature range, and capable of unlimited reads and writes.

Other approaches, "Sawyer-Tower" (see e.g., C. B. Sawyer, C. H. Tower, "Rochelle Salt as a Dielectric," Physical Review, Vol. 35 (February 1930)) and "Shared Charge" (see e.g., Brennan, "Analysis of Electric Fields, Space Charges, and Polarization of Thin Film Ferroelectric Capacitors Based on Landau Theory", MRS Proceedings (Fall 1991), U.S. Pat. No. 5,140,548 (Brennan) and U.S. Pat. No. 5,309,390 (Brennan)), apply a read voltage to ferroelectric memory elements through source follower transistors. Charge is transferred from the ferroelectric elements through the source followers to sense capacitors and the voltage difference across the sense capacitors is amplified to give a digital "1" or "0".

These approaches have slightly different topologies to produce different signal gains and different sensitivities to interconnect capacitance.

Moreover, the sensitivity of these approaches is limited by transistor mismatches and some are sensitive to unbalanced interconnect capacitance. When manufactured in a modern semiconductor facility, these approaches achieve limited sensitivity and yield.

Exemplary embodiments of this invention are capable of high sensitivity in the presence of normal mismatch of semiconductor devices and interconnect capacitances. They are able to measure a small difference-signal capacitance in the presence of circuit mismatches and large unequal interconnect capacitances. The amplifier compensates for typical manufacturing mismatches that would otherwise produce an erroneous signal. It is suitable for non-destructive sensing of ferroelectric memory capacitors.

SUMMARY OF THE DISCLOSURE

An exemplary embodiment of the sense amplifier of this disclosure includes three sections: a common-mode section applies a 'read' voltage to two capacitors in a manner that rejects unequal interconnect capacitance, a difference-mode section generates a signal proportional to the capacitance difference between the two capacitors, and an offset-canceling section compensates for circuit mismatches in the difference-mode section. The two capacitors may be two ferroelectric capacitors comprising a ferroelectric differential capacitance memory unit. The sense amplifier allows improved sensitivity and manufacturability. It allows non-destructive-read ferroelectric memories to achieve desirable yield, density, and operating temperature ranges.

BRIEF DESCRIPTION OF THE DRAWINGS

These and other features and advantages of the invention will readily be appreciated by persons skilled in the art from the following detailed description of an exemplary embodiment thereof, as illustrated in the accompanying drawings, in which.

DETAILED DESCRIPTION OF THE DISCLOSURE

Figure 1:
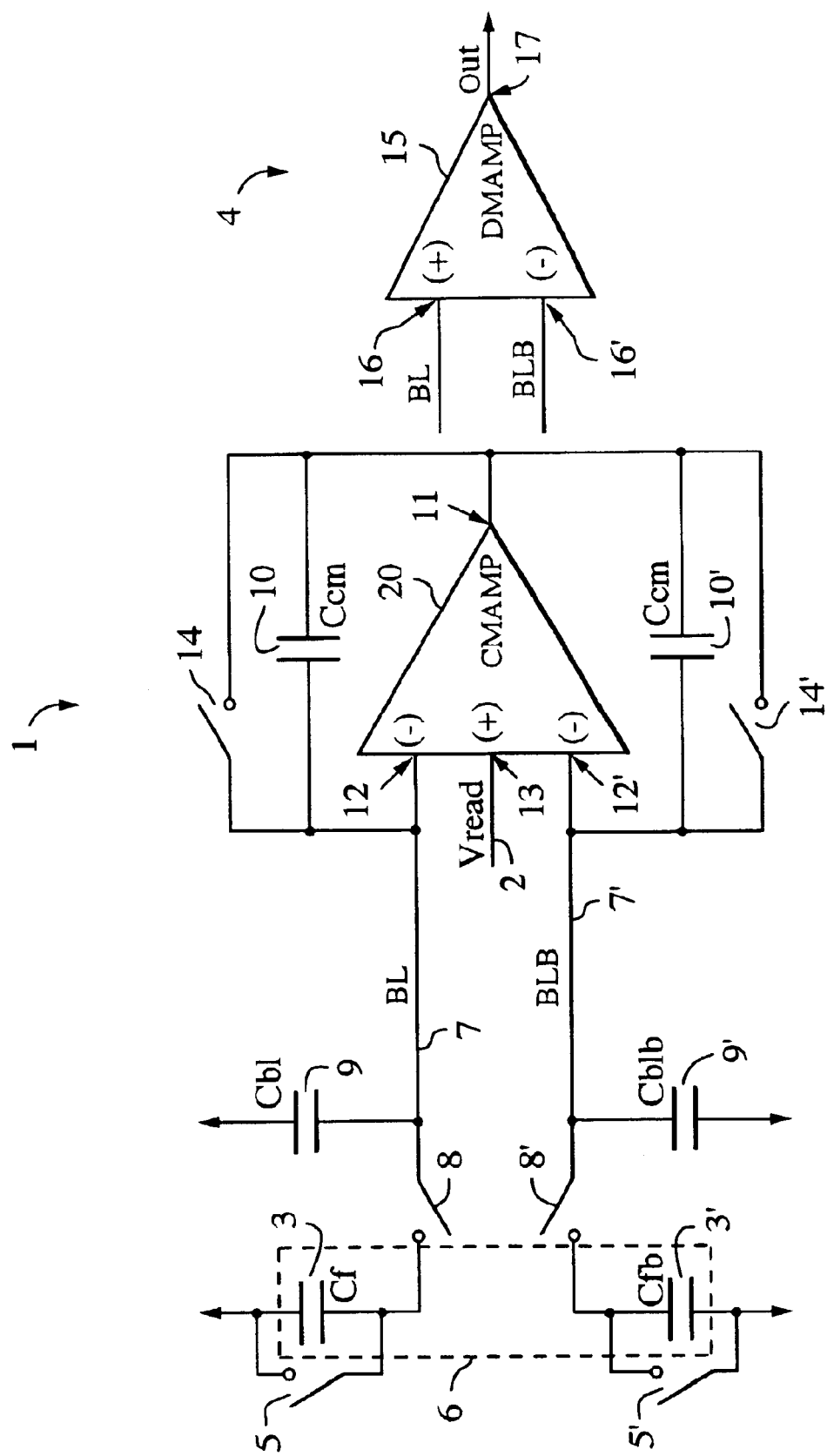
FIG. 1 is a schematic drawing of an embodiment of a differential capacitance sense amplifier circuit.

In the following detailed description and in the several figures of the drawing, like elements are identified with like reference numerals.

FIG. 1 shows an exemplary embodiment of the sense amplifier of the invention which includes a common-mode amplifier (CMAMP) 1 which applies the read voltage 2 to a pair of capacitors Cf 3 and Cfb 3', and a difference-mode amplifier (DMAMP) 4, which senses the differential capacitance signal Cf−Cfb. Shorting-switches 5, 5' are provided for each of the capacitors 3, 3' respectively. The two capacitors 3, 3' may be ferroelectric elements of a ferroelectric differential capacitance memory unit 6.

Bitline 7 (BL) and bitlinebar 7' (BLB) are lines connecting the sense amplifier to the capacitors 3, 3'. Two switches 8, 8' are provided for connecting the bitline 7 and the bitlinebar 7' to the two capacitors Cf 3 and Cfb 3' respectively. The bitline 7 and bitlinebar 7' have parasitic capacitances Cbl 9 and Cblb 9' which are typically one to ten times the size of Cf 3. The parasitic capacitance imbalance Cbl–Cblb can be much larger than Cf–Cfb. The bitline 7 and the bitlinebar 7' have a bitline voltage (V(BL)) and a bitlinebar voltage (V(BLB)) respectively.

In FIG. 1, CMAMP 1 is a three-input transconductance amplifier 20 with a common mode capacitance Ccm 10 connected between the output 11 and one of the (−) inputs 12 and a common mode capacitance Ccm 10' connected between the output 11 and the other (−) input 12'. Typically, the two common mode capacitances Ccm 10, 10' are approximately equal. If placed in a negative feedback configuration, CMAMP 1 will force one or both of the (−) inputs 12, 12' to the same voltage as the (+) input 13; neither of the (−) inputs 12, 12' will be driven to a voltage greater than at the (+) input 13. The common mode capacitances 10, 10' have shorting-switches 14, 14' for shorting the output 11 to the bitline 7 and to the bitlinebar 7' respectively.

DMAMP 4 is an offset-canceling differential amplifier 15. The (+) input 16 connected to the bitline 7 and the (−) input 16' is connected to the bitlinebar 7'.

Figure 2:
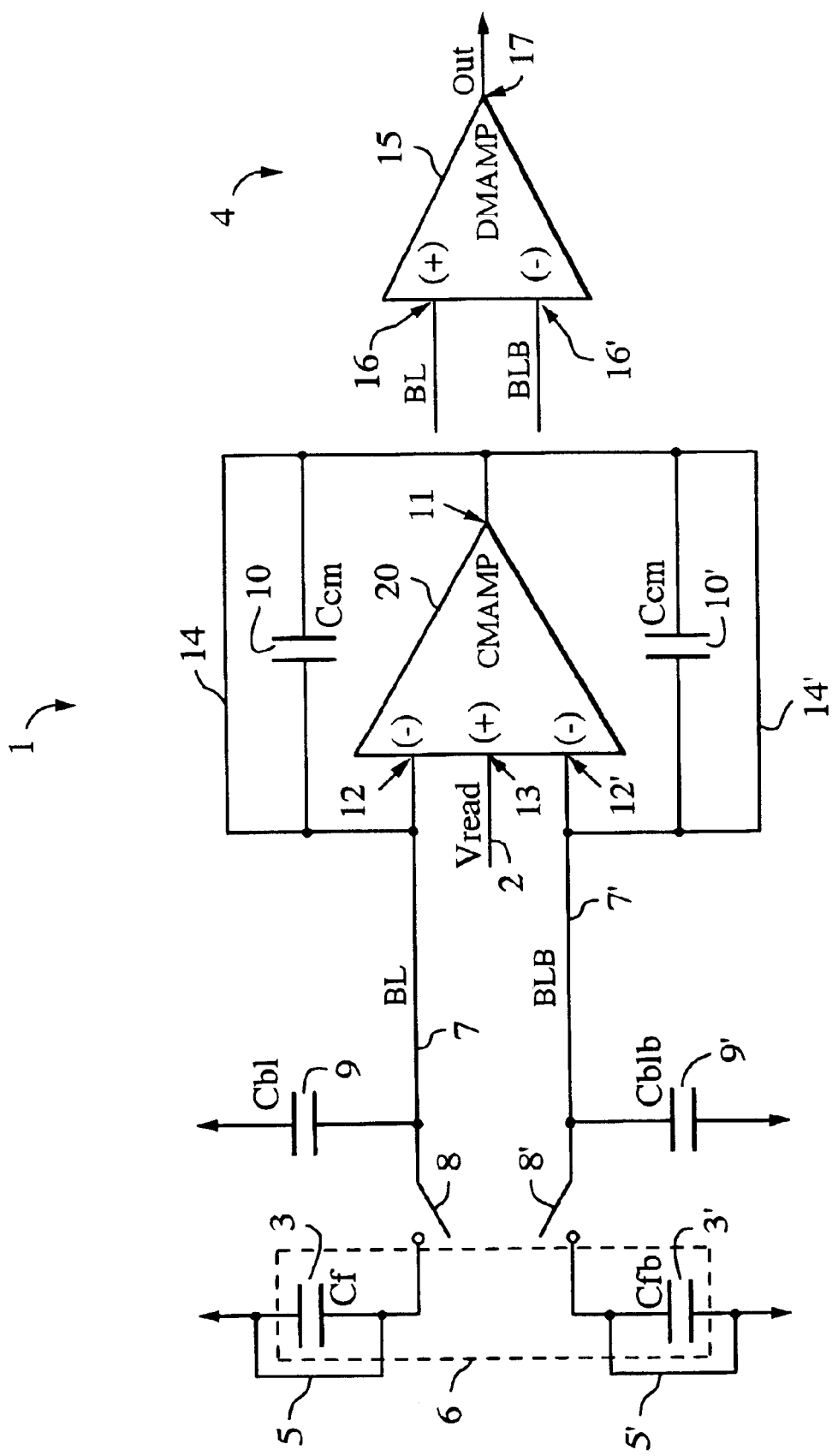
FIG. 2 is a schematic drawing of the differential capacitance sense amplifier circuit of FIG. 1 in a reset mode.

In a further aspect of the invention, FIG. 2 shows the sense amplifier in the reset mode. BL 7 is shorted to BLB 7', CMAMP 1 drives V(BL) and V(BLB) to Vread 2, and the capacitors Cf 3, Cfb 3', and capacitors Ccm's 10, 10' are shorted. The capacitors 3, 3' and the common mode capacitances 10 and 10' can be shorted through respective shorting switches 5, 5', 14 and 14' in the closed position.

Figure 3:
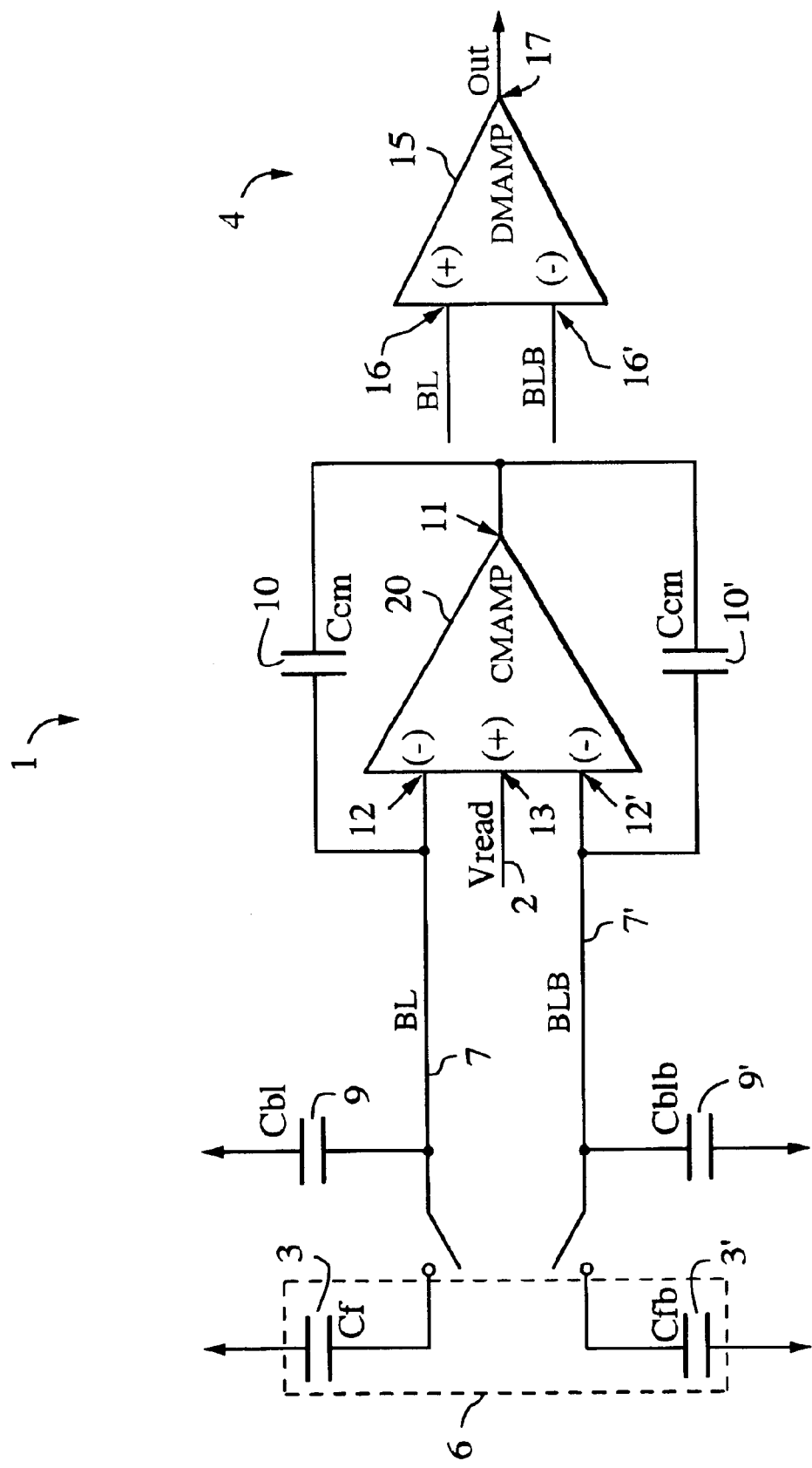
FIG. 3 is a schematic drawing of the differential capacitance sense amplifier circuit of FIG. 1 in a break-before-make mode.

In another aspect of the invention, FIG. 3 shows a break-before-make configuration that briefly occurs when moving from the reset mode to the sense or read mode. The shorting switches 5-5', for capacitors Cf 3 and Cfb 3', and 14-14', for Ccm's 10 and 10', are opened. Voltages V(BL) and V(BLB) are unchanged, remaining at Vread 2. The voltages across capacitors Cf 3, Cfb 3', and both Ccms 10, 10' remain zero.

Figure 4:
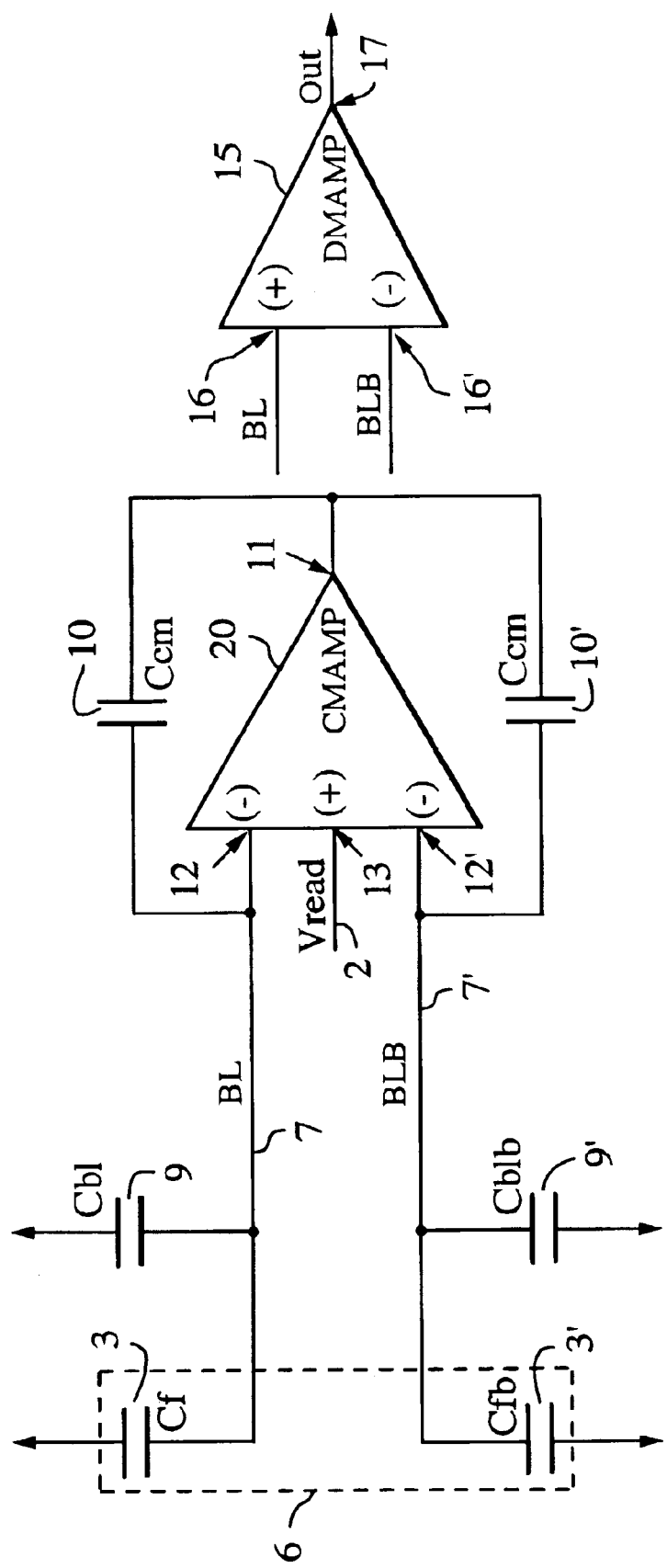
FIG. 4 is a schematic drawing of the differential capacitance sense amplifier circuit of FIG. 1 in a read mode.

In a further aspect of the invention, FIG. 4 shows a configuration for a read mode. The capacitors Cf 3 and Cfb 3,' which may be memory elements of a ferroelectric differential capacitance memory unit 6, are switched onto the bitlines BL 7 and BLB 7', and the voltages V(BL) and V(BLB) initially decrease to less than Vread 2 as charge moves onto Cf 3 and Cfb 3'. Then, CMAMP 1 drives until V(BL) and/or V(BLB) equal Vread 2. DMAMP 4 amplifies the difference signal between the bitline and the bitlinebar (V(BL)−V(BLB), with sufficient gain to provide a digital "1" or "0" at the output 17 of the differential amplifier 15.

This method allows the differential capacitance (Cf–Cfb) to be sensed without error from the parasitic differential capacitance (Cbl–Cblb). This can be shown by writing the charge equations for the three modes, setting V(BL)=Vread when in read mode, and assuming the Ccm capacitors are of equal size, obtaining:

$$Cfb-Cf=(Vread-Vblb)(Ccm+Cfb+Cblb)$$

The difference signal (Cfb–Cf) is not dependent on (Cbl–Cblb), so perfect matching of the parasitic capacitances is not required. This is necessary since (Cbl–Cblb) can be large compared to the signal of interest (Cf–Cfb).

Mismatch between the Ccm capacitors 10, 10' cannot be discerned from (Cf–Cfb); this does not limit performance given typical semiconductor processing and values of Cf and Ccm.

Note that CMAMP 1 and DMAMP 4 can operate independently of each other. For example, CMAMP's operation produces a common-mode input to DMAMP 4, which can be rejected by DMAMP 4 if it has adequate common-mode-input rejection.

Figure 5:
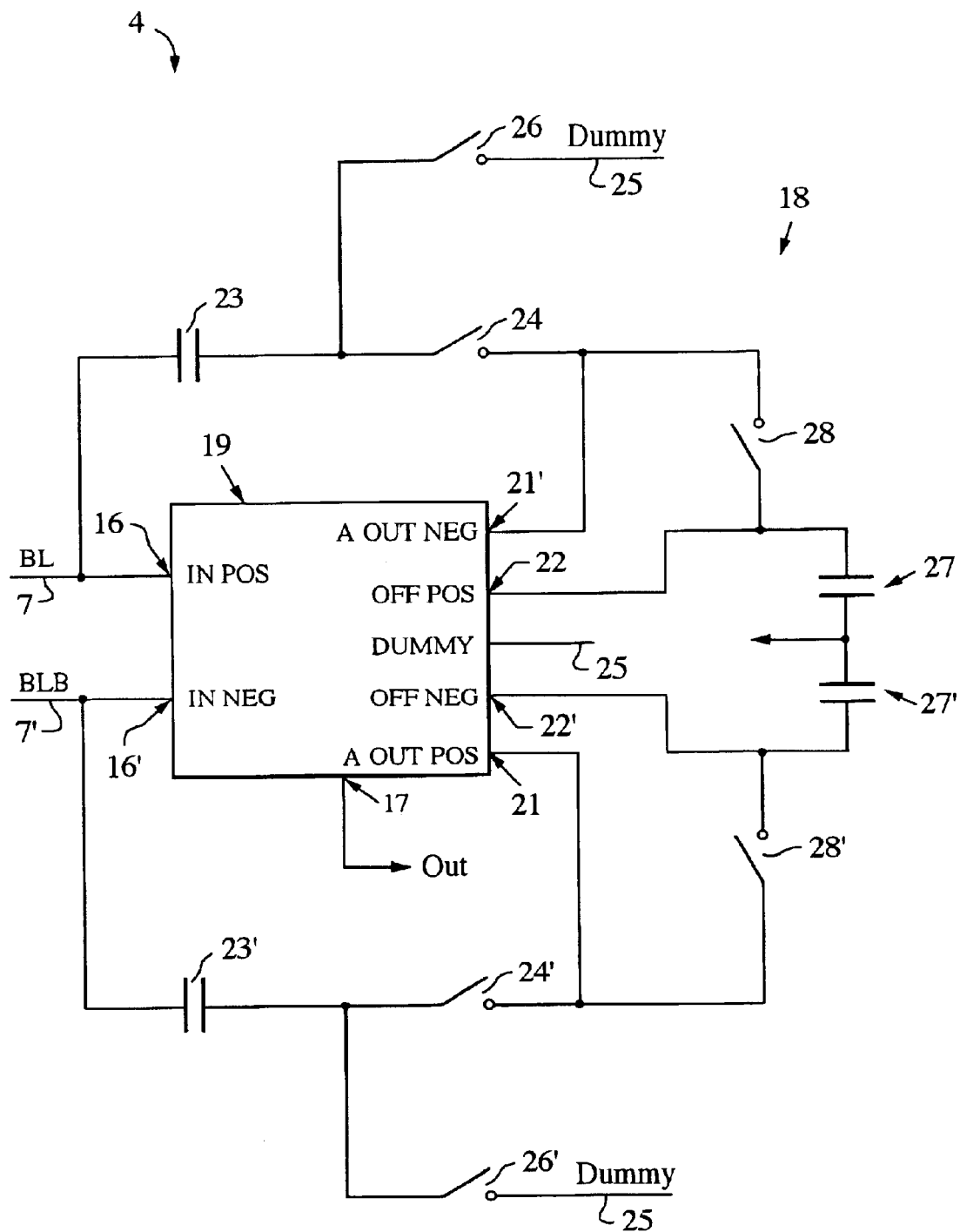
FIG. 5 is a schematic drawing of an offset-canceling section of a differential capacitance sense amplifier circuit.

Typical CMOS amplifier input offset voltages caused by manufacturing variations may limit the useful sensitivity of DMAMP 4. The DMAMP 4 may include an offset-cancelling section 18 to compensate for offsets at the input of DMAMP 4. FIG. 5 shows an embodiment in which DMAMP 4 is an offset-cancelling transconductance amplifier 19 which performs the function of DMAMP 4 shown in FIGS. 1–4. The DMAMP 4 is connected as a differential-input, differential output amplifier 19. Its feedback action will drive Vbl to equal VBlb. It does not respond to input common-mode signals. It has an output common-mode circuit to keep a (+) output (AOUTPOS) 21 and a (−) output (AOUTNEG) 21' centered at approximately one-half the power supply voltage.

The offset-cancelling transconductance amplifier 19 includes a second differential input with a second (+) input (OFFPOS) 22 and a second (−) input (OFFNEG) 22' which are connected in parallel with the primary differential inputs 16, 16'.

During the reset mode, the (+) input 16 and the (−) input 16' are connected together and held at voltage Vread 2, a first and second feedback capacitor (CDM1, CDM2) 23, 23' are disconnected from the feedback loop by switches 24, 24' and connected to d.c. voltage "DUMMY" 25 by switches 26, 26', and amplifier outputs AOUTNEG 21', AOUTPOS 21 are connected to the secondary inputs OFFPOS 22 and OFFNEG 22' and first and second offset-cancelling storage capacitors (CPOS, CNEG) 27, 27' by switches 28, 28'. This stores the offset-canceling voltages on offset-cancelling capacitances CPOS 27 and CNEG 27'. Capacitors CDM1 23 and CDM2 23' are connected to "DUMMY" 25 to minimize common mode storage on CDM1 23 and CDM2 23'; the voltage of "DUMMY" 25 is equal to the common-mode voltage of AOUTNEG 21', AOUTPOS 21.

During the read mode, the offset-canceling voltages stored on offset-cancelling storage capacitors CPOS 27, CNEG 27' remain connected to OFFPOS 22, OFFNEG 22', and the rest of the DMAMP 4 is connected in normal feedback amplifier configuration with feedback capacitors CDM1 23 and CDM2 23'. Switches 24, 24' are closed to connect feedback capacitors CDM1 23 and CDM2 23' to AOUTNEG 21 ' and AOUTPOS 21 respectively. Switches 26, 26' are opened to disconnect "DUMMY" 25 from feedback capacitors CDM1 23 and CDM2 23'. Switches 28, 28' are opened to disconnect (−) output AOUTNEG 21' from (+) input OFFPOS 22 and offset-canceling storage capacitor CPOS 25 and to disconnect (+) output AOUTPOS 21 from (−) input OFFNEG 22' and offset-canceling storage capacitor CNEG 25'.

Although the foregoing has been a description and illustration of specific embodiments of the invention, various modifications and changes thereto can be made by persons skilled in the art without departing from the scope and spirit of the invention as defined by the following claims.

What is claimed is:

1. A differential capacitance sense amplifier, comprising:
   a transconductance common mode amplifier responsive to a read voltage for applying a voltage corresponding to the read voltage to a pair of capacitors in a manner that rejects unequal interconnect capacitance, and
   a differential amplifier for generating a signal proportional to the capacitance difference between a first capacitor of the pair of capacitors and a second capacitor of the pair of capacitors.

2. The differential capacitance sense amplifier of claim 1, wherein:
the transconductance common mode amplifier has
a (+) input for connecting to the read voltage,
a first (−) input connected to a bitline,
a second (−) input connected to a bitlinebar, and
an output connected to the bitline through a first common mode capacitance and connected to the bitlinebar through a second common mode capacitance.

3. The differential capacitance sense amplifier of claim 2, wherein:
the bitline has a first parasitic capacitance and
the bitlinebar has a second parasitic capacitance.

4. The differential capacitance sense amplifier of claim 3, wherein:
the differential amplifier has
a (+) input connected to the bitline,
a (−) input connected to the bitline bar, and
an output.

5. The differential capacitance sense amplifier of claim 4, further comprising:
a shorting-switch for the first common mode capacitance and
a shorting-switch for the second common mode capacitance.

6. The differential capacitance sense amplifier of claim 5, further comprising:
a shorting-switch for the first capacitor of the pair of capacitors and a shorting-switch for the second capacitor of the pair of capacitors.

7. The differential capacitance sense amplifier of claim 6, further comprising:
a switch for connecting the bitline to the first capacitor of the pair of capacitors and a switch for connecting the bitlinebar to the second capacitor of the pair of capacitors.

8. The differential capacitance sense amplifier of claim 7, wherein the pair of capacitors is a pair of ferroelectric capacitors of a ferroelectric differential capacitance memory unit.

9. A differential capacitance sense amplifier comprising:
a common-mode section responsive to a read voltage for applying a voltage corresponding to the read voltage to a pair of capacitors in a manner that rejects unequal interconnect capacitance,
a difference-mode section for generating a signal proportional to the capacitance difference between a first capacitor of the pair of capacitors and a second capacitor of the pair of capacitors, and
an offset-canceling section to compensate for circuit mismatches in the difference-mode section.

10. The differential capacitance sense amplifier of claim 9, wherein the common-mode section includes:
a transconductance common mode amplifier with a (+) input for connecting to a read voltage, a first (−) input connected to a bitline, a second (−) input connected to a bitlinebar, and an output connected to the bitline through a first common mode capacitance and connected to the bitlinebar through a second common mode capacitance.

11. The differential capacitance sense amplifier of claim 10, wherein:
the bitline has a first parasitic capacitance and
the bitlinebar has a second parasitic capacitance.

12. The differential capacitance sense amplifier of claim 11, further comprising:
a shorting switch for the first common mode capacitance and a shorting switch for the second common mode capacitance, and
a switch for connecting the bitline to the first capacitor of the pair of capacitors and a switch for connecting the bitlinebar to the second capacitor of the pair of capacitors, and
a shorting switch for the first capacitor of the pair of capacitors and a shorting switch for the second capacitor of the pair of capacitors.

13. The differential capacitance sense amplifier of claim 9, wherein:
the difference-mode section includes:
a differential amplifier with a first differential input with a first (+) input and a first (−) input, the first (+) input being connected to the bitline and the first (−) input being connected to the bitline bar and an output.

14. The differential capacitance sense amplifier of claim 13, wherein the offset-canceling section includes:
a second differential input of the differential amplifier with a second (+) input connected to a first offset-canceling storage capacitor and a second (−) input connected to a second offset-canceling storage capacitor,
the second (+) input being switchably connected to a (−) output of the differential amplifier and the second (−) input being switchably connected to a (+) output of the differential amplifier, and
the (−) output of the differential amplifier being switchably connected to the first (+) input through a first feedback capacitor and the (+) output of the differential amplifier being switchably connected to the first (−) input through a second feedback capacitor.

15. The differential capacitance sense amplifier of claim 9 wherein the pair of capacitors is a pair of ferroelectric capacitors of a ferroelectric differential capacitance memory unit.

16. A method for using a differential capacitance sense amplifier to read a differential capacitance between a first capacitor of a pair of capacitors and a second capacitor of a pair of capacitors, comprising:
placing the differential capacitance sense amplifier into a reset mode, wherein
a read voltage is applied to a (+) input of a transconductance common mode amplifier,
an output of the common mode amplifier is shorted to a bitline, the bitline having a first parasitic capacitance and being connected to a first (−) input of the common mode amplifier,
the output of the common mode amplifier is shorted to a bitlinebar, the bitlinebar having a second parasitic capacitance and being connected to a second (−) input of the common mode amplifier,
the bitline is connected to a first (+) input of a differential amplifier,
the bitlinebar is connected to a first (−) input of a differential amplifier,
a bitline switch for connecting the bitline to the first capacitor is in the open position,
a bitlinebar switch for connecting the bitlinebar to the second capacitor is in the open position, the first capacitor is shorted through a first shorting-switch, and the second capacitor is shorted through a second shorting-switch.

17. The method of claim 16, wherein in the reset mode:

the output of the common mode amplifier is shorted to the bitline through a shorting-switch for a first common mode capacitance connected between the output of the common mode amplifier and the bitline, the output of the common mode amplifier is shorted to the bitlinebar through a shorting-switch for a second common mode capacitance connected between the output of the common mode amplifier and the bitlinebar.

18. The method of claim 16, wherein placing the differential capacitance sense amplifier into the reset mode includes:

opening the bitline switch, and opening the bitlinebar switch.

19. The method of claim 16, wherein placing the differential capacitance sense amplifier into the reset mode includes:

closing the first shorting-switch, and closing the second shorting-switch.

20. The method of claim 16, wherein placing the differential capacitance sense amplifier into the reset mode includes:

closing the shorting-switch for the first common mode capacitance, and closing the shorting-switch for the second common mode capacitance.

21. The method of claim 16, wherein placing the differential capacitance sense amplifier into the reset mode includes:

applying the read voltage to the (+) input of the common mode amplifier.

22. The method of claim 16 wherein the first common mode capacitance and the second common mode capacitance are approximately equal.

23. The method of claim 16 wherein the pair of capacitors is a pair of ferroelectric capacitors of a ferroelectric differential capacitance memory unit.

24. The method of claim 16, wherein placing the differential capacitance sense amplifier into the reset mode includes:

closing a switch connecting the first (+) input of the differential amplifier to a dummy voltage through a first feedback capacitor and opening a switch connecting the first (+) input of the differential amplifier to a (−) output of the differential amplifier through the first feedback capacitor, closing a switch connecting the first (−) input of the differential amplifier to the dummy voltage through a second feed back capacitor and opening a switch connecting the first (−) input of the differential amplifier to a (+) output of the differential amplifier through the second feedback capacitor, closing a switch connecting the (−) output of the differential amplifier to a second (+) input of the differential amplifier and to a first offset-canceling storage capacitor, and closing a switch connecting the (+) output of the differential amplifier to a second (−) input of the differential amplifier and to a second offset-canceling storage capacitor.

25. The method of claim 16, further comprising the steps of:

placing the differential capacitance sense amplifier into a break-before-make mode wherein:

a read voltage is applied to a (+) input of a transconductance common mode amplifier, the bitline switch is open, the bitlinebar switch is open, the output of the common mode amplifier is connected to the bitline through a first common mode capacitance and the bitline is connected to the first (−) input of the common mode amplifier, the output of the common mode amplifier is connected to the bitlinebar through a second common mode capacitance and the bitlinebar is connected to the second (−) input of the common mode amplifier, the first shorting-switch is open, the second shorting-switch is open, the bitline is connected to the first (+) input of the differential amplifier, and the bitlinebar is connected to the first (−) input of the differential amplifier.

26. The method of claim 25, wherein in the step of placing the differential capacitance sense amplifier into the break-before-make mode includes:

opening a shorting-switch for the first common mode capacitance, and opening a shorting-switch for the second common mode capacitance.

27. The method of claim 25, wherein in the step of placing the differential capacitance sense amplifier into the break-before-make mode includes:

opening the first shorting-switch and opening the second shorting-switch.

28. The method of claim 25 wherein the first common mode capacitance and the second common mode capacitance are approximately equal.

29. The method of claim 25, further comprising the steps of placing the differential capacitance sense amplifier into a read mode wherein:

a read voltage is applied to the (+) input of the transconductance common mode amplifier, the bitline is connected to the first capacitor of the pair of capacitors, the bitlinebar is connected to the second capacitor of the pair of capacitors, the output of the common mode amplifier is connected to the bitline through the first common mode capacitance and the bitline is connected to the first (−) input of the common mode amplifier, the output of the common mode amplifier is connected to the bitlinebar through the second common mode capacitance and the bitlinebar is connected to the second (−) input of the common mode amplifier, the bitline is connected to the first (+) input of the differential amplifier, the bitlinebar is connected to the first (−) input of the differential amplifier.

30. The method of claim 29, wherein in the read mode:

the first (+) input of the differential amplifier is connected to a (−) output of the differential amplifier through a first feedback capacitor, the first (−) input of the differential amplifier is connected to a (+) output of the differential amplifier through a second feedback capacitor.

31. The method of claim 29, wherein placing the differential capacitance sense amplifier into a read mode includes:

opening a switch connecting the first (+) input of the differential amplifier to a dummy voltage through a first feedback capacitor and closing a switch connecting the first (+) input of the differential amplifier to a (−) output of the differential amplifier through the first feedback capacitor, opening a switch connecting the first (−) input of the differential amplifier to the dummy voltage through a second feedback capacitor and closing a switch connecting the first (−) input of the differential amplifier to a (+) output of the differential amplifier through the second feedback capacitor, opening a switch connecting the (+) output of the differential amplifier to the second (+) input of the differential amplifier and to a first offset-canceling storage capacitor, and opening a switch connecting the (+) output of the differential amplifier to the second (−) input of the differential amplifier and to a second offset-canceling storage capacitor.

32. The method of claim 29, wherein placing the differential capacitance sense into the read mode includes:

closing the bitline switch, and closing the bitlinebar switch.

33. The method of claim 29, wherein the first common mode capacitance is approximately equal to the second common mode capacitance.

34. The method of claim 29, wherein the pair of capacitors is a pair of ferroelectric capacitors of a ferroelectric differential capacitance memory unit.

35. The method of claim 29 comprising the steps:

first placing the differential capacitance sense amplifier into the reset mode, then placing the differential capacitance sense amplifier into the break-before-make mode, and then placing the differential capacitance sense amplifier into the read mode.

36. The method of claim 31 comprising the steps:

first placing the differential capacitance sense amplifier into the reset mode, then placing the differential capacitance sense amplifier into the break-before-make mode, and then placing the differential capacitance sense amplifier into the read mode.

* * * * *

UNITED STATES PATENT AND TRADEMARK OFFICE
CERTIFICATE OF CORRECTION

PATENT NO.   : 6,803,794 B2
DATED        : October 12, 2004
INVENTOR(S)  : Mark V. Martin and John J. Drab It is certified that error appears in the above-identified patent and that said Letters Patent is hereby corrected as shown below:

Column 1,
Line 2, insert the following:
-- This invention was made with Government support under Contract No. N00030-00-C-0002 #1050 awarded by the Department of the Navy. The Government has certain rights in this invention. --

Signed and Sealed this

Seventeenth Day of May, 2005

JON W. DUDAS
*Director of the United States Patent and Trademark Office*